(12) United States Patent
Wang et al.

(10) Patent No.: US 9,888,584 B2
(45) Date of Patent: Feb. 6, 2018

(54) CONTACT STRUCTURES WITH POROUS NETWORKS FOR SOLDER CONNECTIONS, AND METHODS OF FABRICATING SAME

(71) Applicant: Invensas Corporation, San Jose, CA (US)

(72) Inventors: Liang Wang, Milpitas, CA (US); Rajesh Katkar, San Jose, CA (US); Hong Shen, Palo Alto, CA (US); Cyprian Emeka Uzoh, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/942,781

(22) Filed: Nov. 16, 2015

(65) Prior Publication Data

US 2016/0192496 A1    Jun. 30, 2016

Related U.S. Application Data

(60) Provisional application No. 62/098,925, filed on Dec. 31, 2014.

(51) Int. Cl.
| | |
|---|---|
| *H05K 1/11* | (2006.01) |
| *H01L 23/00* | (2006.01) |
| *H05K 3/40* | (2006.01) |
| *H05K 3/34* | (2006.01) |

(52) U.S. Cl.
CPC ........... *H05K 3/4007* (2013.01); *H01L 24/81* (2013.01); *H05K 1/111* (2013.01); *H05K 3/3431* (2013.01); *H01L 2224/81193* (2013.01)

(58) Field of Classification Search
CPC .... H05K 1/111; H05K 3/4007; H05K 3/3431; H01L 24/81; H01L 2224/81193
See application file for complete search history.

(56) References Cited

U.S. PATENT DOCUMENTS

| | | | |
|---|---|---|---|
| 5,088,007 A * | 2/1992 | Missele | B23K 35/0222 165/185 |
| 5,262,718 A | 11/1993 | Svendsen et al. | |
| 5,818,700 A | 10/1998 | Purinton | |
| 6,803,265 B1 | 10/2004 | Ngo et al. | |
| 7,705,458 B2 | 4/2010 | Suh et al. | |
| 7,745,013 B2 | 6/2010 | Choe et al. | |
| 8,492,892 B2 | 7/2013 | Daubenspeck et al. | |
| 9,583,470 B2 * | 2/2017 | Karhade | H01L 25/18 |
| 2005/0024067 A1 * | 2/2005 | Yamaguchi | G01R 1/0735 324/719 |
| 2007/0152016 A1 | 7/2007 | Choe et al. | |
| 2010/0121064 A1 | 5/2010 | Dahmen et al. | |
| 2011/0014743 A1 | 1/2011 | Young et al. | |

(Continued)

OTHER PUBLICATIONS

H. Oppermann et al., "Nanoporous Interconnects", Electronic System-Integration Technology Conference (ESTC), 2010 3rd, pp. 1-4, DOI: 10.1109/ESTC.2010.5643002.

(Continued)

*Primary Examiner* — Hoa C Nguyen
(74) *Attorney, Agent, or Firm* — Haynes and Boone, LLP

(57) ABSTRACT

A contact pad includes a solder-wettable porous network (310) which wicks the molten solder (130) and thus restricts the lateral spread of the solder, thus preventing solder bridging between adjacent contact pads.

14 Claims, 15 Drawing Sheets

(56) References Cited

U.S. PATENT DOCUMENTS

| | | | |
|---|---|---|---|
| 2011/0063812 A1* | 3/2011 | Nakanishi | ......... H01L 23/49827 361/783 |
| 2012/0211764 A1 | 8/2012 | Okamoto et al. | |
| 2014/0221700 A1 | 8/2014 | Radivojevic et al. | |
| 2014/0326289 A1 | 11/2014 | Bennet | |
| 2014/0376202 A1* | 12/2014 | Shibutani | ......... H01L 23/49811 361/767 |
| 2015/0050773 A1 | 2/2015 | Martini et al. | |
| 2015/0231612 A1 | 8/2015 | Dai et al. | |

OTHER PUBLICATIONS

N. Atanassov and V. Mitreva, "Electrodeposition and Properties of Nickel-Manganese Layers," Surface and Coating Technology, vol. 78, Issues 1-3, Jan. 1996, pp. 144-149.

S. H. Goods, J. J. Kelly and N.Y.C. Yang, "Electrodeposited Nickel-Manganese: an Alloy for Microsystem Applications," Microsystem Technologies, Oct. 2004, vol. 10, Issue 6-7, pp. 498-505.

Duan You-gou, Fu Wei-Chang and Peng Qing-jing, "Mechanism of Nickel-Aluminum alloy electroplating," Journal of Wuhan University of Technology-Mater. Sci. Ed., Mar. 2003, vol. 18, Issue 1, pp. 20-21.

George A. Di Bari. Electrodeposition of nickel, Modern Electroplating, 5th Edition, edited by Mordechai Schlesinger and Milan Paunovich, John Wiley and Sons, 2010, pp. 79-114.

S. Alec Watson, "Nickel Alloy Plating", Nickel Development Institute, ASM International, 1994.

E. Zakel et al., "High Speed Laser Solder Jetting Technology for Optoelectronics and MEMS Packaging", ICEP 2002.

B. Schwenzer et al., "Tuning the Optical Properties of Mesoporous $TiO_2$ Films by Nanoscale Engineering", Langmuir 2012, 28, 10072-10081, American Chemical Society.

Bartl, M. H.; Puls, S. P.; Tang, J.; Lichtenegger, H. C.; Stucky, G., "D. Cubic mesoporous frameworks with a mixed semiconductor nanocrystalline wall structure and enhanced sensitivity to visible light". Angew. Chem., Int. Ed. 2004, 43, 3037-3040.

Choi, S. Y.; Mamak, M.; Coombs, N.; Chopra, N.; Ozin, G. A. "Thermally stable two-dimensional hexagonal mesoporous nanocrystalline anatase, meso-nc-$TiO_2$: Bulk and crack-free thin film morphologies", Adv. Funct. Mater. 2004, 14, 335-344.

Wang, D.; Ma, Z.; Dai, S.; Liu, J.; Nie, Z.; Engelhard, M. H.; Huo, Q.; Wang, C.; Kou, R. Low-temperature synthesis of tunable mesoporous crystalline transition metal oxides and applications as Au catalyst supports, J. Phys. Chem. C 2008, 112, 13499-13509.

N. Verplanck et al., "Wettability Switching Techniques on Superhydrphobic Surfaces", Nanoscale Res Lett (2007), 2:577-596, DOI 10.1007/s11671-007-9102-4.

Xia et al., "Smart responsive surfaces switching reversibly between super-hydrophobicity and super-hydrophilicity", Soft Matter, 2009, 5, 275-281.

* cited by examiner

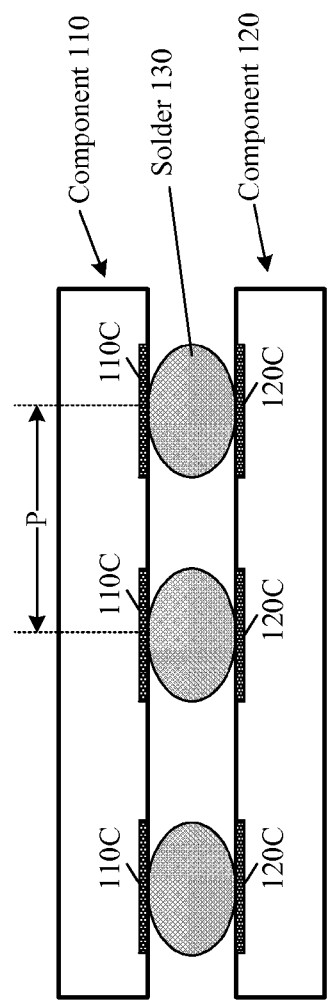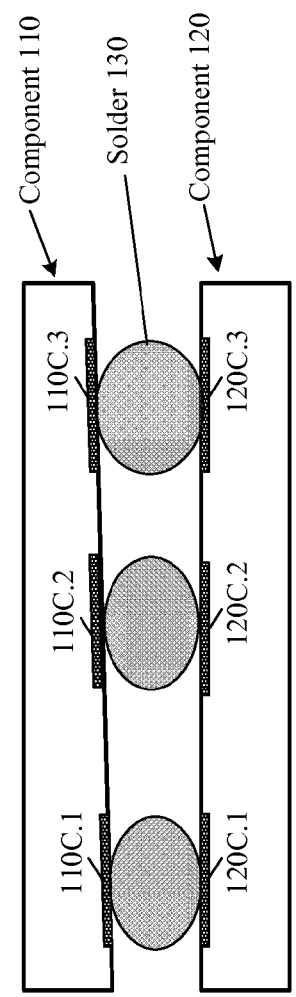
FIG. 1 PRIOR ART
FIG. 2 PRIOR ART

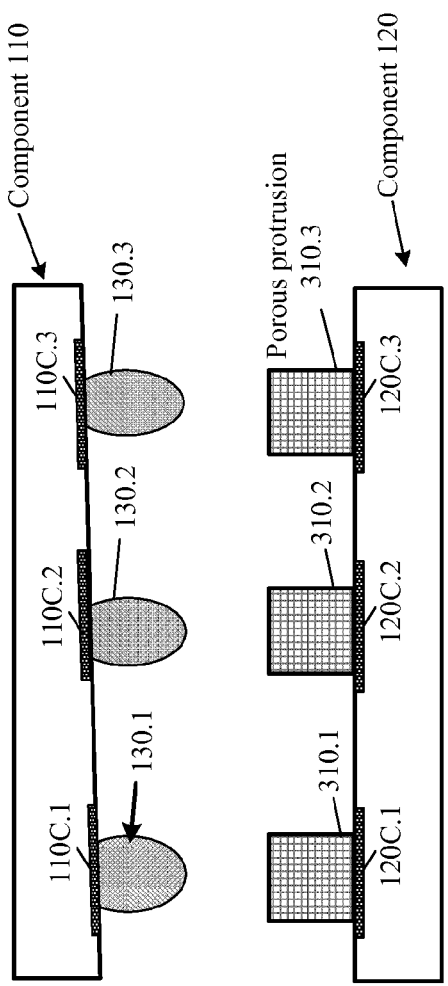
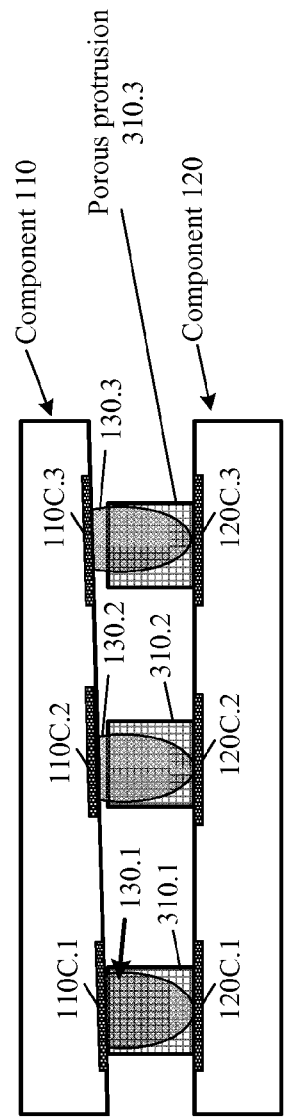
FIG. 3A
FIG. 3B

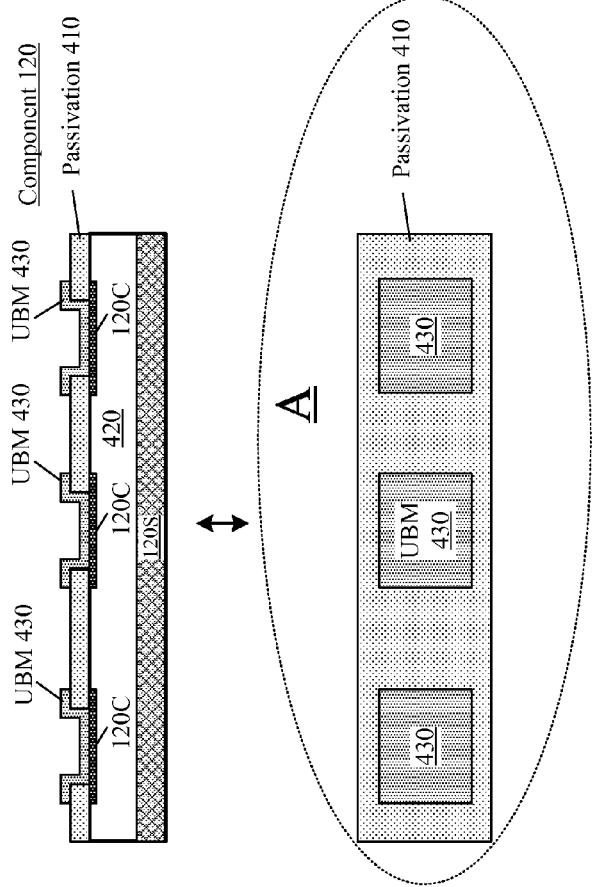
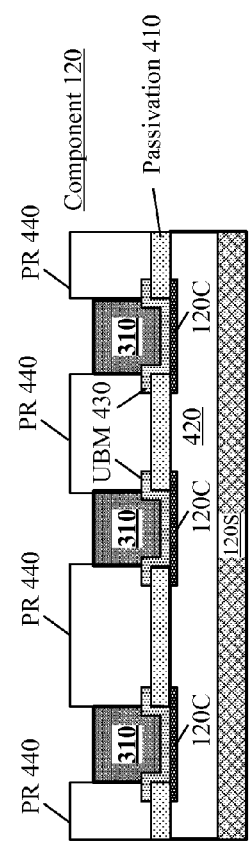
FIG. 4A
FIG. 4B

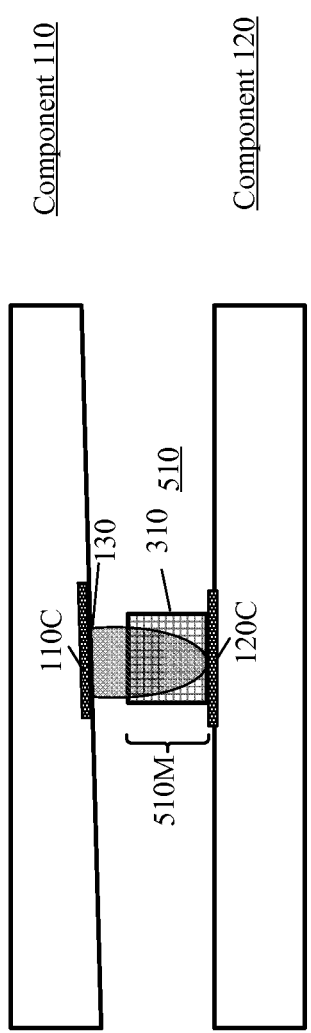

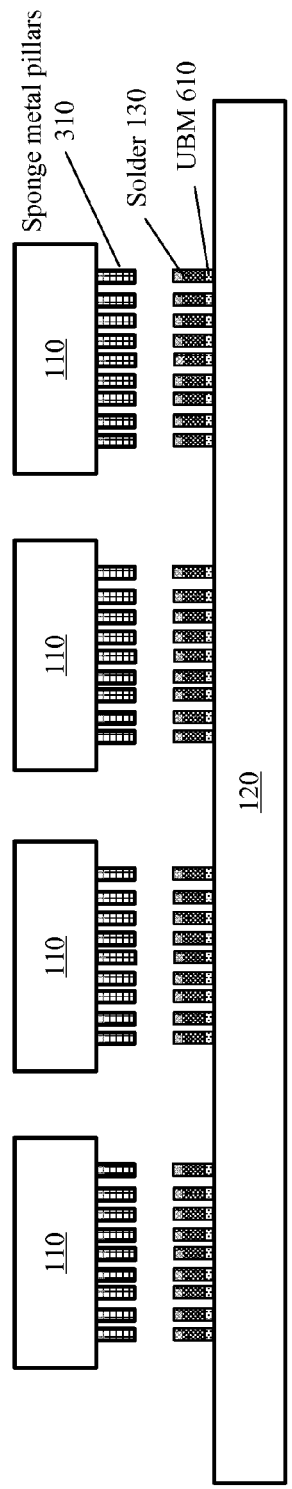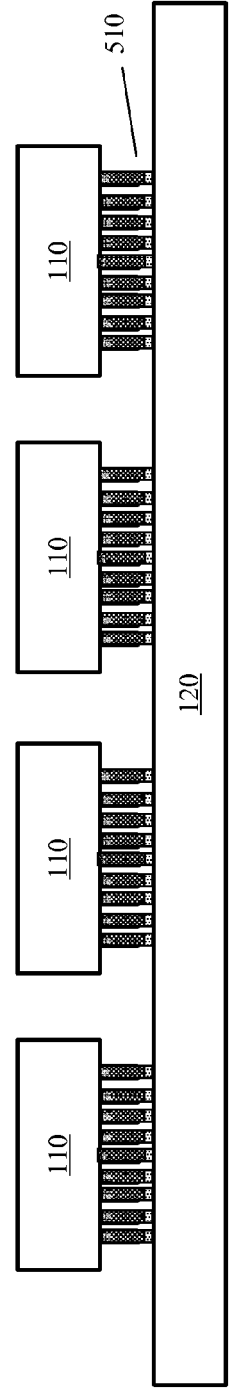

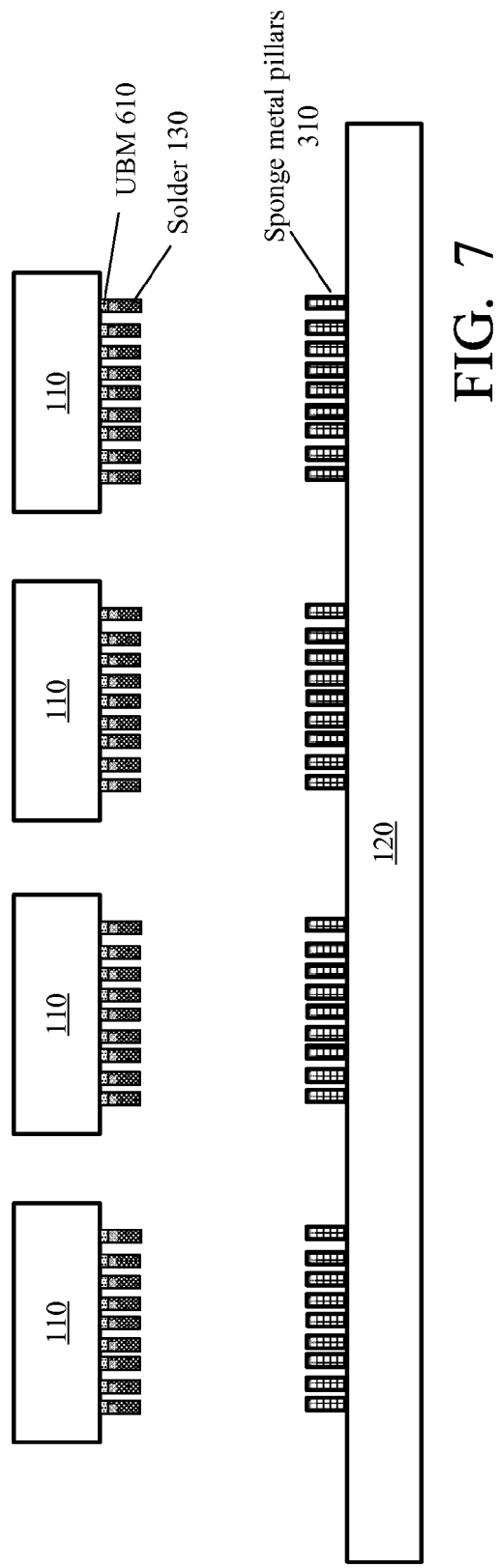

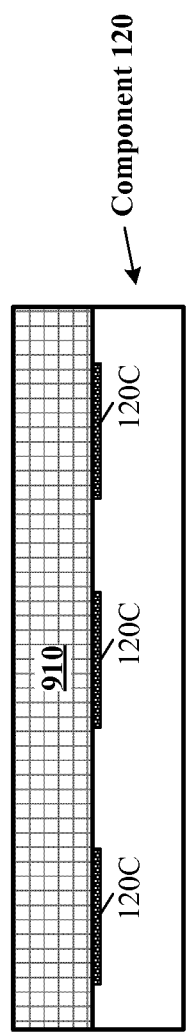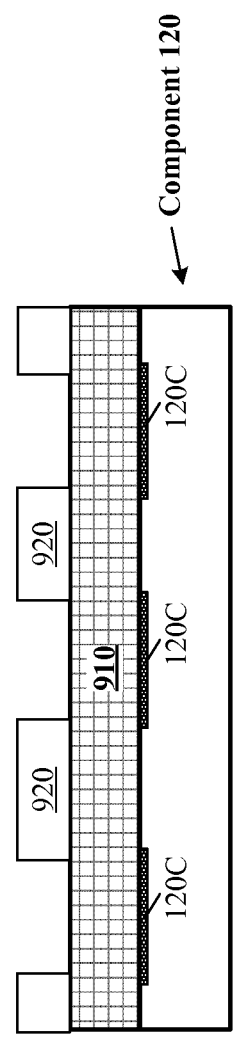

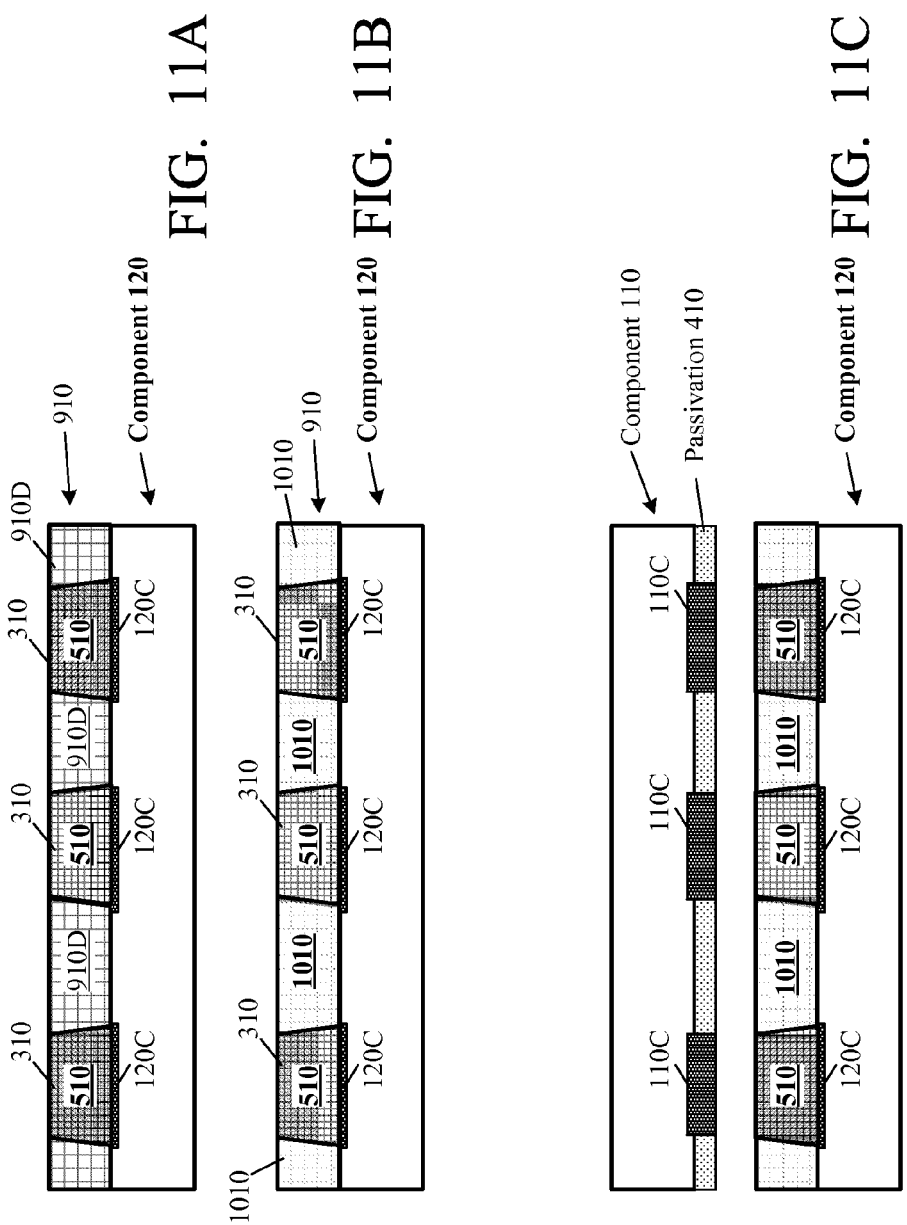

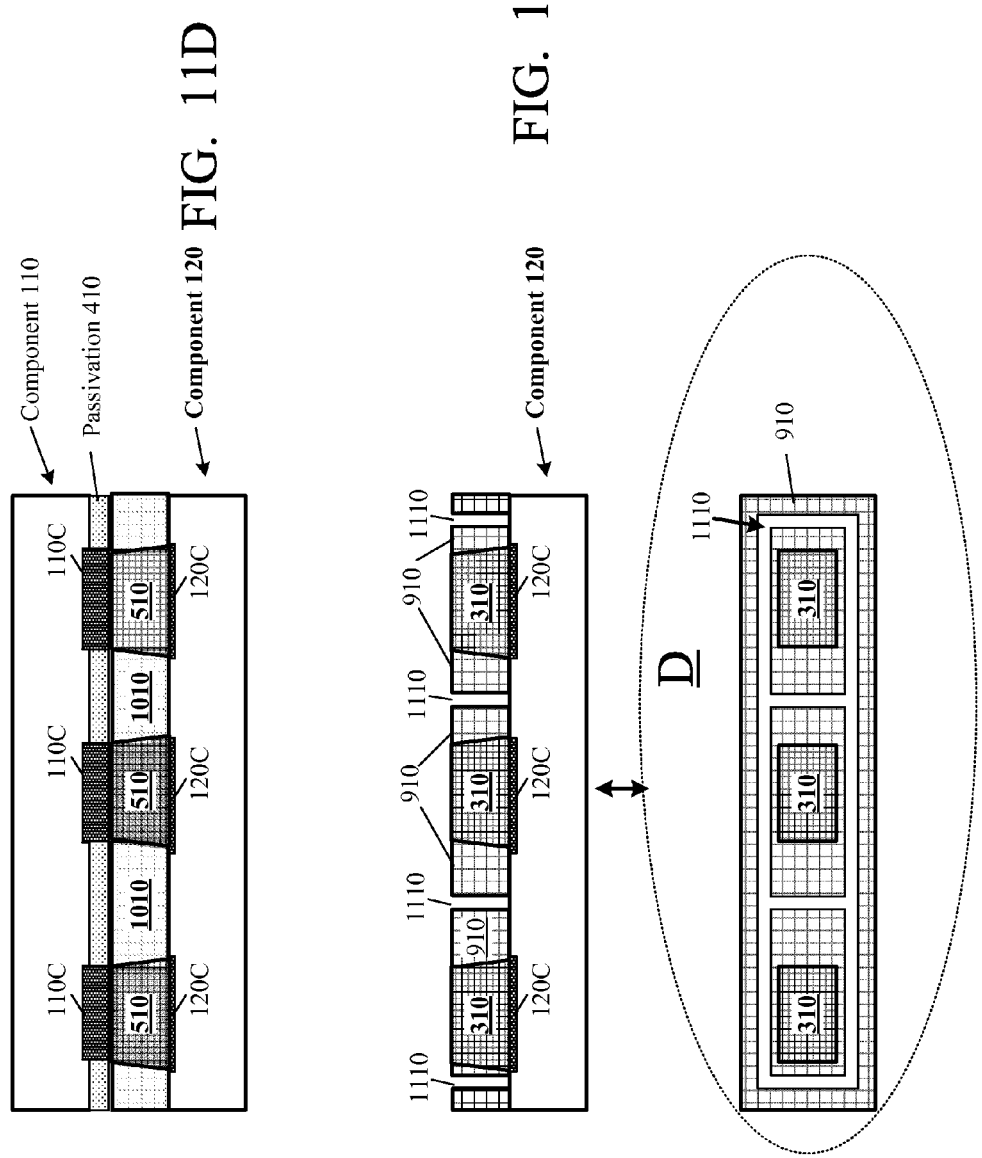

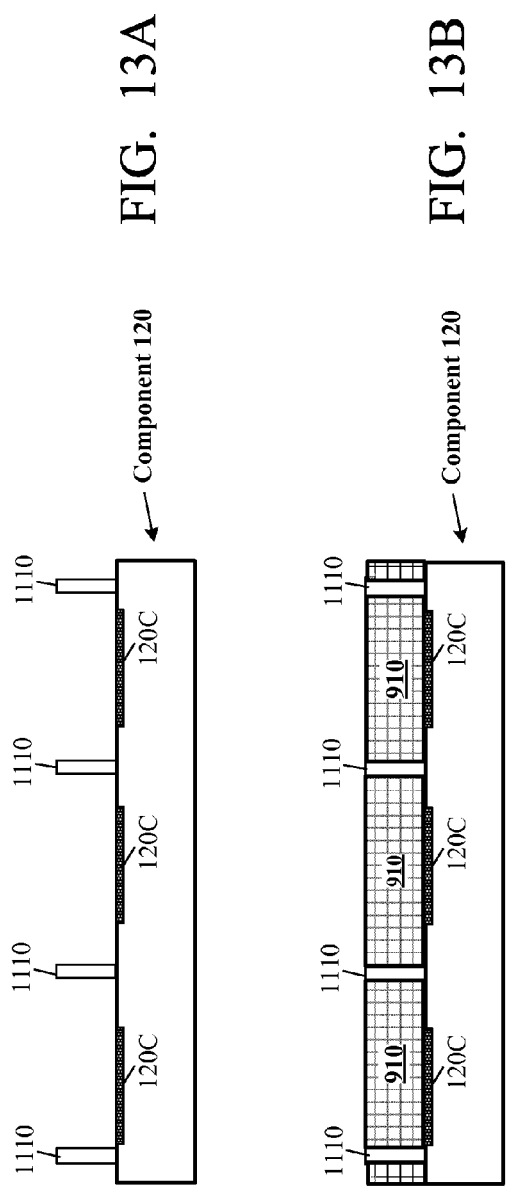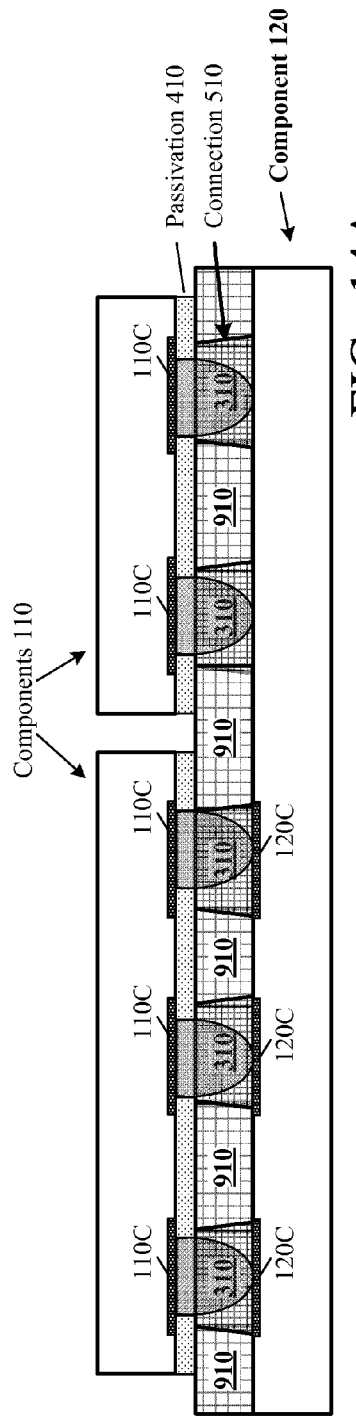

CONTACT STRUCTURES WITH POROUS NETWORKS FOR SOLDER CONNECTIONS, AND METHODS OF FABRICATING SAME

CROSS REFERENCE TO RELATED APPLICATIONS

The present application claims priority of U.S. provisional patent application No. 62/098,925 filed Dec. 31, 2014, incorporated herein by reference.

BACKGROUND OF THE INVENTION

The present invention relates to solder connections that can be used, for example, for interconnection of microelectronic components.

The microelectronics industry has experienced an ever increasing demand for smaller and faster electronic devices able to support a greater number of increasingly complex and sophisticated functions. Accordingly, there is a continuing trend in the semiconductor industry to manufacture small, low-cost, high-performance, and low-power integrated circuits (ICs) with densely packed contact pads. However, such ICs are difficult to connect to each other or to other devices. For example, an IC having a size of 1×1 cm may have 70000 contact pads that must be connected to other components. A common way to connect contact pads to other components is by solder; solder connections are inexpensive, and advantageously they can be easily undone if rework is needed (e.g. to replace a defective component). However, densely packed contact pads can be shorted ("bridged") by molten solder. Consequently, the solder volume must be rigidly controlled, and sometimes only minimal amounts of solder can be used, resulting in weaker connections. Therefore, solder connections are sometimes replaced by slower, more expensive diffusion bonding (which involves pressing and holding the contact pads together at a high temperature until they get attached to each other through interdiffusion). There is a need for inexpensive soldering techniques suitable for densely packed contact pads.

Another problem with solder connections for densely packed contact pads is a high planarity requirement. FIG. 1 illustrates components 110, 120 whose respective contact pads 110C and 120C are joined together by solder 130. Any one of components 110 and 120 can be a semiconductor wafer with integrated circuits (ICs), or can be a semiconductor die (also called "chip", obtained by dicing a wafer), or can be a non-semiconductor substrate (e.g. a printed circuit board). Components 110 and 120 are shown as if perfectly planar, but perfect planarity is hardly ever achievable. FIG. 2 shows the same structure with a non-planar component 110. The distance between contact pads 110C.2 and 120C.2 is larger than between contact pads 110C.1 and 120C.1, and the distance between contact pads 110C.3 and 120C.3 is still larger. Since the planarity is not perfectly controllable, solder bumps 130 have to be sufficiently large to accommodate the worst case, such as between contact pads 110C.3 and 120C.3. However, larger solder bumps can cause bridging. For a 1×1 cm die with 70000 contact pads, the pitch P (FIG. 1) between the adjacent contact pads is about 38 μm, and for reliable solder interconnection the die planarity should be below 5 nm, which is difficult or impossible to achieve in modern technology. Therefore, improved interconnection techniques are desired.

SUMMARY

This section summarizes some features of the invention. Other features may be described in the subsequent sections. The invention is defined by the appended claims, which are incorporated into this section by reference.

Some embodiments provide solder connection techniques which relax the planarity requirement and avoid bridging of densely packed contact pads. More particularly, a contact pad includes a porous solder-wettable protrusion that prevents the solder from spreading to adjacent contact pads. One example is shown in FIGS. 3A, 3B. FIG. 3A shows components 110 and 120 before soldering, and FIG. 3B shows the two components soldered together. Component 110 is the same non-planar component as in FIG. 2. Component 120 is similar to that of FIG. 2, but contact pads 120C are augmented with porous protrusions 310 (shown as 310.1, 310.2, 310.3). Protrusions 310 are solder wettable. They can be open-pore metal networks (sponge metal) or some other type.

The solder bumps are marked 130.1, 130.2, 130.3 at respective contact pads 110C.1, 110C.2, 110C.3. As shown in FIG. 3B, solder 130.1 is entirely absorbed by the pores in protrusion 310.1. Solder 130.2 is only partly absorbed by the pores in protrusion 310.2, and the rest of solder 130.2 is above the protrusion. Solder 130.2 may or may not reach the underlying pad 120C.2. Similarly, only part of solder 130.3 is absorbed by protrusion 310.3. The solder's lateral flow is restrained by the wettability of protrusions 310. The portions of solder connections 130.2 and 130.3 above the protrusions 310.2 and 310.3 do not spread laterally because the protrusions 310.2 and 310.3 are solder wettable and they hold the solder in place by capillary action.

In some embodiments, protrusions 310 are solder wettable regions in a porous dielectric layer. They protrude above non-porous or less porous contact pads, but they may or may not protrude out of the surrounding non-solder-wettable regions of the porous dielectric layer.

The protrusions can be provided on component 110 instead of 120, or on both components.

The invention is not limited to the features described above. For example, in some embodiments, some solder may spread laterally, e.g. due to small combined open-pore volume or for any other reason. The invention is not limited to particular dimensions or materials, or by the types of components 110 and 120. Other embodiments and variations are within the scope of the invention as defined by the appended claims.

BRIEF DESCRIPTION OF THE DRAWINGS

FIGS. 1, 2 illustrate vertical cross sections of components according to prior art.

FIGS. 3A, 3B illustrate vertical cross sections of components according to some embodiments of the present invention.

FIG. 4A illustrates a vertical cross section and a top view of a component according to some embodiments of the present invention.

FIG. 4B illustrates a vertical cross section of a component according to some embodiments of the present invention.

FIGS. 4D, 5, 6A, 6B, 7, 8A, 8B, 8C, 9A, 9B illustrate vertical cross sections of components according to some embodiments of the present invention.

FIGS. 11A, 11B, 11C, 11D illustrate vertical cross sections of components according to some embodiments of the present invention.

FIG. 12 illustrates a vertical cross section and a top view of a component according to some embodiments of the present invention.

FIGS. 13A, 13B, 14A, 14B illustrate vertical cross sections of components according to some embodiments of the present invention.

DESCRIPTION OF SOME EMBODIMENTS

Figure 4C:
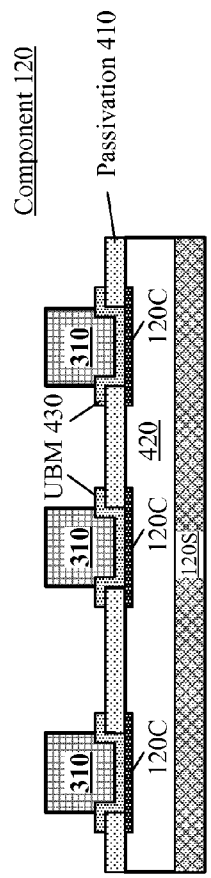
FIG. 4C illustrates a vertical cross section and a top view of a component according to some embodiments of the present invention.

The embodiments described in this section illustrate but do not limit the invention. The invention is not limited by dimensions, materials, or other features, except as defined by the appended claims.

Referring to the example of FIGS. 3A and 3B, protrusions 310 can be formed by known techniques. Low temperature techniques are preferred if the components 110 and 120 cannot withstand high temperatures. In particular, in some embodiments, the protrusions 310 are formed at temperatures not exceeding the soldering temperature. Exemplary techniques include depositing a possibly non-porous composite material and then at least partially leaching out one or more components of the composite material—for example, depositing a metal alloy and then at least partially leaching out one or more alloy components.

One suitable technique is described in H. Oppermann et al., "Nanoporous Interconnects", Electronic System-Integration Technology Conference (ESTC), 2010 3rd, pages 1-4, DOI: 10.1109/ESTC.2010.5643002, incorporated herein by reference. According to the Oppermann article, this technique was used to form compressible nanoporous gold bumps joined together by thermocompression without solder. The gold bump formation is described in the article as follows. A gold-silver alloy is plated on a gold or copper surface. The gold content in the alloy is 20 to 30%. Then the silver is etched out to leave a porous gold layer as an open-pore sponge with 70 to 80% porosity and a pore and ligament sizes from 15 nm to 360 nm; the pore size increases with higher etching time and temperature.

In some embodiments of the present invention, porous protrusions 310 are formed as follows. The component 120 can be of any type, including the type of FIG. 3B or FIG. 4A. In FIG. 4A, component 120 includes a dielectric passivation layer 410 that protects the circuitry in component 120 from corrosion. In addition, component 120 may include a semiconductor or dielectric substrate 120S with transistor regions, capacitor plates, resistors, and/or other circuit elements (including contact pads 120C) formed in substrate 120S and/or an overlying layer 420. Contact pads 120C are recessed in passivation layer 410, but this is not necessary. Under ball metallization (UBM) 430 is provided over each contact pad 120C to protect the contact pad from environmental corrosion and provide a suitable top surface for the silver-gold alloy deposition. In some embodiments, layer 410 is a polymeric layer, and UBM 430 is TiW/Au or TiN/Au formed by sputtering, or Cu/Ni/Au formed by sputtering and plating, or some other kind. UBM 430 is not porous. An exemplary top view of the structure is shown in insert A. The geometries and materials are not limiting. For example, UBM 430 can be square in top view, or circular, or any other shape.

Then the silver-gold alloy is deposited, possibly by plating as in the Oppermann article cited above. FIG. 4B illustrates an exemplary plating process. In this process, a photoresist layer 440 is deposited and patterned to expose the UBM 430 over each contact pad 120C. Then the silver-gold alloy is plated to form possibly non-porous protrusions 310. (In some embodiments, the alloy plating is preceded by plating of a gold layer as described in the Oppermann article.) An exemplary alloy composition is 20 to 30% gold, and the rest is silver. The alloy composition can vary depending on the desired porosity, pore size, and possibly other parameters. The thickness of layer 310 can be 10 µm as in an example given in the Oppermann article, or can be some other value.

Resist 440 is then stripped. Before or after the resist stripping, the silver is at least partially etched away to turn protrusions 310 into open porous network over the contact pads 120C. The resulting structure can be as in FIG. 4C showing a vertical cross section, with insert B shows an exemplary top view.

To re-iterate, the precise shapes and dimensions are not limiting. In some embodiments, the height of protrusions 310 is at least 10 µm, and each protrusion is a circle or a square in top view with the maximum dimension (diameter or diagonal) of 500 µm. The precise dimensions may depend, for example, on the desired solder volume to be accommodated by the each protrusion.

Then structure 120 is joined to structure 110 (FIG. 4D) as described above in connection with FIG. 3B. Any one of structures 110 or 120 can be a wafer, and it may or may not be diced before the joining operation; thus, the process is suitable for chip-to-chip, chip-to-wafer, and wafer-to-wafer assembly. Component 110 can be any type, including possibly a component with a substrate and circuit elements such as described above for component 120 of FIG. 4B.

Figure 4D:
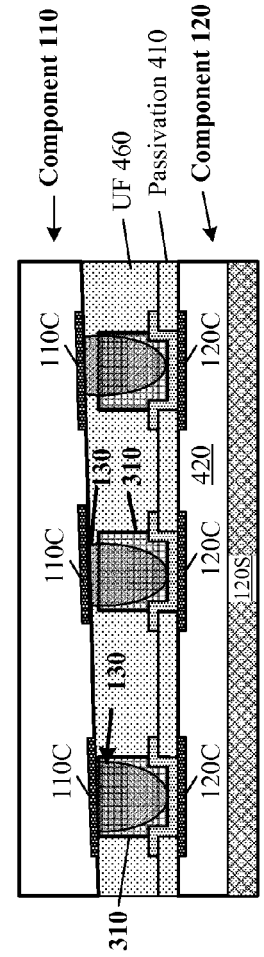

In FIG. 4D, component 110 is shown above component 120, but this is not necessary—component 110 can be below component 120 or in some other orientation, with solder 130 being wicked by solder-wettable protrusions 310. Generally, the invention is not limited to the orientation shown in the drawings unless otherwise indicated.

Optionally, underfill 460 is formed to encapsulate each protrusion 310 and glue the components 110 and 120 to each other in the areas surrounding the protrusions. Underfill 460 is dielectric, possibly filled organic polymeric material.

UBM 430 is omitted in some embodiments. Also, contact pads 120C do not have to be recessed, and may be even with the rest of the top surface of component 120 or may protrude out at the top surface of component 120. Passivation 410 can be omitted. Other processes can be used; for example, layer 310 can be first deposited over the whole component 120 without a mask 440 and can be patterned later, either before or after leaching out the silver. Other variations are possible.

The solder wettability property may depend on the solder composition. In some embodiments, a tin/lead solder is used, or a lead free solder. The solders may or may not contain tin, indium, silver, gold, and/or other metal and non-metal components. In some embodiments, wettability to at least one of the solder components is sufficient to provide desired wettability to the entire solder.

FIG. 5 shows on a larger scale an exemplary connection 510 between a contact pad 110C and a contact pad 120C (the drawings are not necessarily to scale). UBM is not shown and may or may not be present as noted above. Protrusion 310 may or may not reach the contact pad 110C. Each connection 510 includes a protrusion 310 and solder 130. Numeral 510M indicates a segment of connection 510; porous protrusion 310 runs through the entire segment 510M. Connection 510 may or may not include a solder portion above protrusion 310 (above segment 510M). Solder 130 may or may not reach the contact pad 120C or other conductive surface of component 120. The conductive surface can be non-porous or can have lower porosity than protrusion 310. Solder may or may not be present on the outer sidewall surface of protrusion 310. The entire connection 510, or at least its segment 510M, is laterally surrounded by dielectric medium, eg. underfill 460 or air, which physically contacts the entire lateral surface of connection 510. Within segment 510M, the dielectric medium physically contacts the entire exterior surface of the connection, including any exterior pore surfaces not blocked by the solder. The height of segment 510M can be the entire height of connection 510 or protrusion 310, or at least as large as X % of the height of protrusion 310 where X is a suitable number greater than 0, e.g. 10%, or 20%, or 30%, or 40%, or 50%, or 60%, or 70%, or 80%, or 90%, or 95%, or 99%, or 100%, or some other number. Alternatively, the height of segment 510M can be X % of the minimal and/or maximal distance between the components 110 and 120, where X can be any value given above.

Protrusions 310 of the same or other shapes and dimensions described above can be made from other materials, e.g. metals used as Raney catalysts (sponge catalysts), possibly nickel catalysts. In an exemplary process, at the stage of FIG. 4B, protrusion 310 are formed by depositing an alloy of some metallic element or compound "M" with nickel or copper by an electroless or electroplating process. M can be aluminum, silicon, magnesium, manganese, or some other metal. Trace amounts of a promoter metal can be added. Exemplary plating techniques are described in the following articles incorporated herein by reference:

N. Atanassov and V. Mitreva, "Electrodeposition and Properties of Nickel-Manganese Layers," Surface and Coating Technology, Volume 78, Issues 1-3, January 1996, pages 144-149;

S. H. Goods, J. J. Kelly and N. Y. C. Yang, "Electrodeposited Nickel-Manganese: an Alloy for Microsystem Applications," Microsystem Technologies, October 2004, Volume 10, Issue 6-7, pp. 498-505;

Duan You-gou, Fu Wei-Chang and Peng Qing-jing, "Mechanism of Nickel-Aluminum alloy electroplating," Journal of Wuhan University of Technology-Mater. Sci. Ed., March 2003, volume 18, Issue 1, pp. 20-21;

George A. Di Bari. Electrodeposition of nickel, Modern Electroplating, 5th Edition, edited by Mordechai Schlesinger and Milan Paunovich, John Wiley and Sons, 2010, pages 79-114;

S. Alec Watson, "Nickel Alloy Plating", Nickel Development Institute, ASM International, 1994.

Then the M component is at least partially leached out by a suitable etch. For example, magnesium and manganese can be leached out by acetic acid, and aluminum and silicon by sodium hydroxide. In both cases, a 10 to 40 weight percent solution can be used.

Another possibility is to plate an alloy of a transition metal and aluminum, then at least partially leach out aluminum, similar to preparation of Johnson Matthey Sponge Metal™ catalysts. See e.g. U.S. pre-grant patent publication no. 2010/0121064 A1 (May 13, 2010, inventor: Dahmen et al.), incorporated herein by reference.

These exemplary techniques do not limit the invention. Exemplary pore sizes can be 2 nm to 5 μm, and the porosity can be 10% to 95%, and other pore sizes and porosities may be suitable. Nanoporous materials, possibly mesoporous, are used in some embodiments.

The remaining processing steps can be as described above in connection with FIGS. 4A through 5.

The techniques described above are suitable for chip-to-chip, chip-to-wafer, and wafer-to-wafer bonding. FIGS. 6A-6B show a chip-to-wafer example. Multiple chips 110 are provided with porous protrusions 310 (e.g. sponge metal pillars) formed by any of the techniques described above. Wafer 120 is provided with solder bumps 130 formed on UBM 610 by any known techniques or other techniques, including possibly stencil printing, gang ball placement, solder jetting (see e.g. E. Zakel et al., "High Speed Laser Solder Jetting Technology for Optoelectronics and MEMS Packaging", ICEP 2002, incorporated herein by reference), electroplating, electroless plating, or some other technique. FIG. 6A shows the components 110, 120 before the chip-to-wafer attachment; FIG. 6B shows the structure after the attachment.

FIG. 7 illustrates another chip-to-wafer process, with solder pillars on chips 110 and with porous pillars 310 on wafer 120. The components are shown before the attachment. After the attachment, the structure is essentially as in FIG. 6B. In some embodiments, wafer 120 has some contact pads with protrusions 310 and other contact pads with solder pillars 130. Some of the chips 110 have solder that attaches to porous protrusions 310 on wafer 120, while other chips have porous protrusions 310 that attach to solder 130 on wafer 120. In some embodiments, each component 110, 120 has contact pads with solder 130 and other contact pads with porous protrusions 310; the solder on each component attaches to a porous protrusion on another component.

Figure 8A:
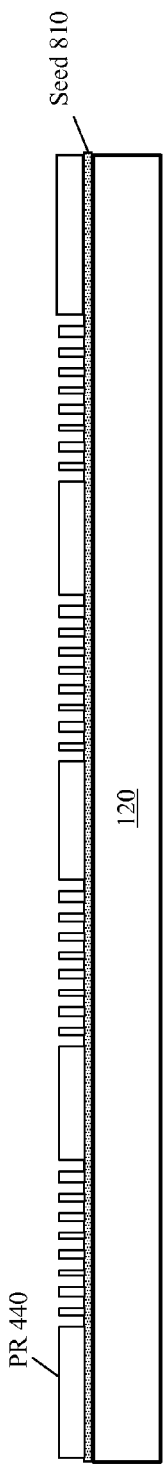
Figure 8B:
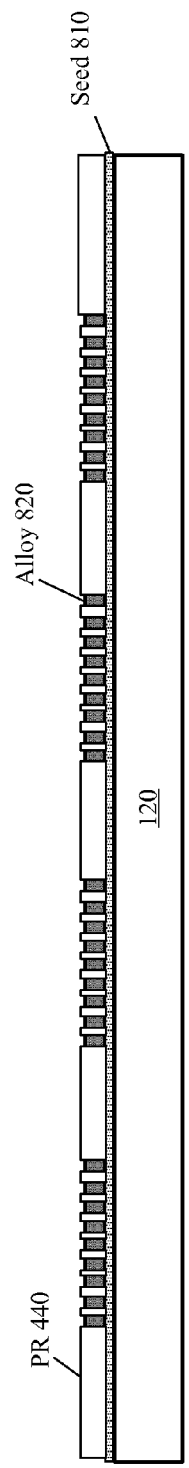
Figure 8C:
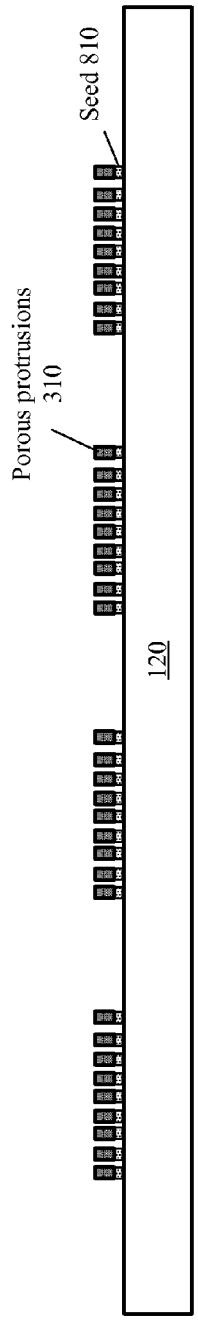

FIGS. 8A-8C illustrate a process for forming porous protrusions 310 on a wafer 120 as in FIG. 7. This is a variation of the process described above in connection with FIGS. 4A-5. The same process can be used for chips 110 in FIG. 6A, possibly before the chips are separated from their respective wafers. Seed layer 810 is formed over the whole wafer. Photoresist 440 is deposited and patterned to expose seed 810 in desired areas. Layer 820 (FIG. 8B), e.g. an alloy, is plated on the exposed areas, electrolessly or by electroplating. Resist 440 is then stripped. If layer 820 is easily oxidizable, e.g. a nickel alloy, a thin gold layer (not shown, possibly 50 nm thick) can be electrolessly plated on top. Seed layer 810 is then etched away between the protrusions 820. (If desired, the seed layer can be chosen as a different material than 820 to improve selectivity of this etch and protect the seed layer under the protrusions 820). The resulting structure is shown in FIG. 8C.

In some embodiments, porous structures 310 are solder-wettable regions of a larger layer which is non-solder-wettable around the structures 310. In some embodiments, the non-solder-wettable regions are dielectric. For example, initially the whole layer can be formed as non-solder-wettable, and then selected regions (310) can be made solder-wettable. Alternatively, initially the whole layer can be solder-wettable, then selected regions can be made non-solder-wettable while the remaining regions (310) remain solder-wettable.

An exemplary process is as follows. Non-solder-wettable, porous, dielectric layer 910 (FIG. 9A), possibly 0.3 to 10 μm thick, or of some other thickness, is formed over and in physical contact with contact pads 120C. Layer 910 may or may not cover the whole top surface of component 120. The top and bottom surfaces of component 120 and layer 910 are shown as planar but may have any topography. A photoresist mask 920 (FIG. 9B), possibly dry tape resist, is formed on layer 910 and patterned to expose those regions (310) of dielectric 910 which are to become solder-wettable (e.g. the regions over contact pads 120C). The exposed regions (including regions 310, see FIG. 9C) are made solder wettable by a suitable process; exemplary processes are described below. These regions may or may not be electrically conductive since electrical conductivity will be provided by solder.

Figure 9C:
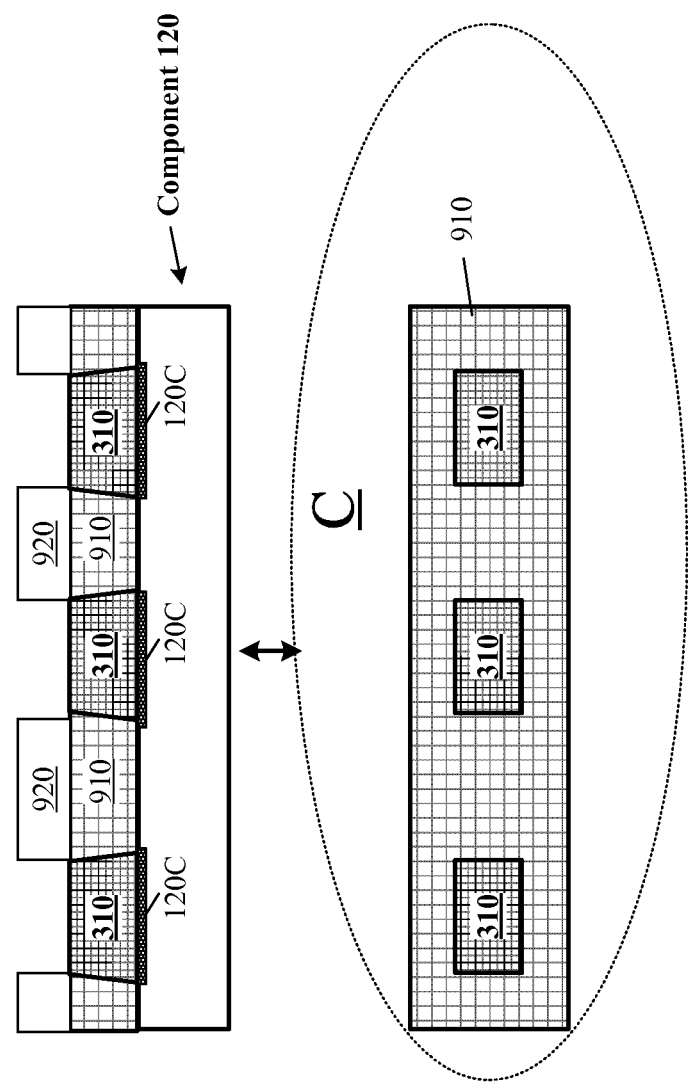
FIG. 9C illustrates a vertical cross section and a top view of a component according to some embodiments of the present invention.

An exemplary top view after removing the resist 920 is shown in insert C in FIG. 9C. Each wettable region 310 is completely surrounded by a non-wettable region of dielectric 910, and the entire sidewall of each region 310 is in physical contact with the non-wettable region. These details are optional, and each region 310 may have any shape in top view.

Figure 9D:
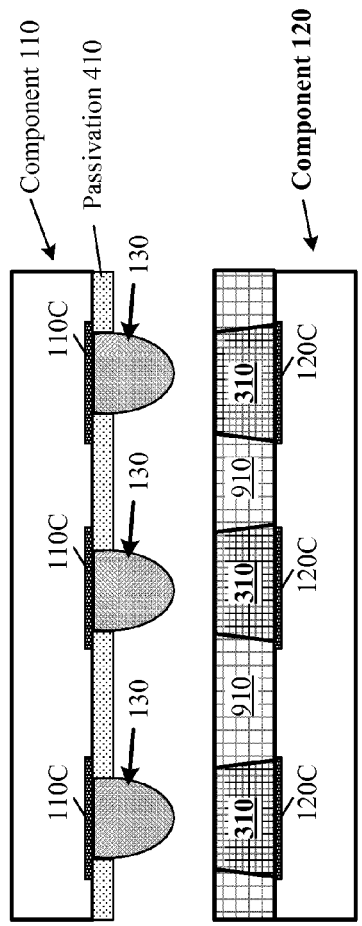
FIGS. 9D, 9E illustrate vertical cross sections of components according to some embodiments of the present invention.
Figure 9E:
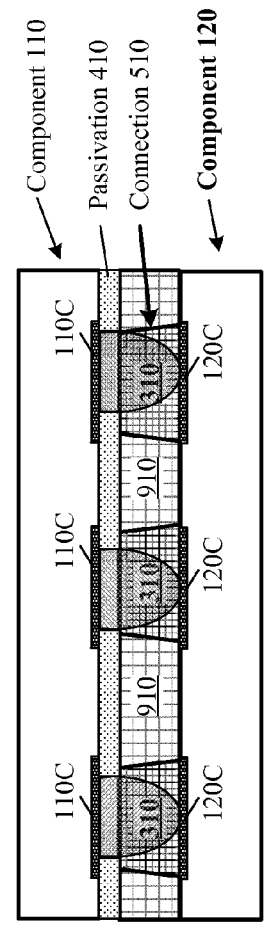

Component 120 is then aligned with component 110 (FIG. 9D), which has been provided with solder bumps 130. The two components are joined together (FIG. 9E). Solder 130 wets the regions 310 but not the surrounding, non-solder-wettable regions, so solder 130 is restricted to regions 310. The resulting connections are shown at 510.

In some embodiments, component 110 includes a passivation layer 410 overlying component 110 from below, possibly covering the whole bottom surface of component 110 except at solder bumps 130. (As noted above, the terms like "below" refer to the orientation shown in the drawings, not necessarily the actual orientation during fabrication or use of the components.) In some embodiments, at the stage of FIG. 9E, passivation 410 attaches to dielectric 910 to strengthen the structure (similar to underfill). For example, passivation 410 can be organic polymeric material, e.g. polyimide, that adheres to layer 910 at the soldering temperature.

In some embodiments, multiple components 120 are fabricated in this way in a single wafer, which is singulated at any suitable stage, possibly after removing the resist 920, possibly before or after attachment to component(s) 110. Multiple components 110 with solder can be attached to a single component 120, or multiple components 110 with porous regions 310 can be attached to a single component 120 with solder, similarly to FIGS. 6A, 6B, 7.

Now exemplary materials and processes for fabrication of layer 910 and switching the wettability of regions 310 will be described for illustration. In some embodiments, layer 910 is a non-solder-wettable organic or inorganic material, possibly a transition metal oxide, possibly an inorganic semiconductor such as titania, zinc oxide, or vanadium oxide. For example, a porous titania layer can be formed by a sol-gel method which involves mixing a polymer solution with a titanium tetraethoxide HCl solution to form a gel, depositing the gel on component 120, and annealing the gel in air at a fairly low temperature, in the range of 350° C. to 450° C., as described in B. Schwenzer et al., "Tuning the Optical Properties of Mesoporous $TiO_2$ Films by Nanoscale Engineering", Langmuir 2012, 28, 10072-10081, American Chemical Society, incorporated herein by reference. The pore size can be between 3.3 and 4.9 nm. The porosity can be 25% to 65%, and the film thickness 150 nm to 500 nm (estimated from Tables 1 and 2 in the Schwenzer et al. reference). Other dimensions, temperatures and processes are also possible.

See also the following documents incorporated herein by reference describing fabrication of mesoporous structures that can be possibly used as layer 910:

Bard, M. H.; Puls, S. P.; Tang, J.; Lichtenegger, H. C.; Stucky, G., "D. Cubic mesoporous frameworks with a mixed semiconductor nanocrystalline wall structure and enhanced sensitivity to visible light". Angew. Chem., Int. Ed. 2004, 43, 3037-3040;

Choi, S. Y.; Mamak, M.; Coombs, N.; Chopra, N.; Ozin, G. A. "Thermally stable two-dimensional hexagonal mesoporous nanocrystalline anatase, meso-nc-TiO2: Bulk and crack-free thin film morphologies", Adv. Funct. Mater. 2004, 14, 335-344.

Wang, D.; Ma, Z.; Dai, S.; Liu, J.; Nie, Z.; Engelhard, M. H.; Huo, Q.; Wang, C.; Kou, R. Low-temperature synthesis of tunable mesoporous crystalline transition metal oxides and applications as Au catalyst supports", J. Phys. Chem. C 2008, 112, 13499-13509.

Figure 10:
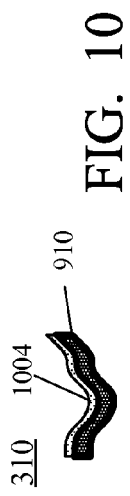
FIG. 10 illustrates a part of a porous network in a component formed according to some embodiments of the present invention.

Making the regions 310 solder wettable (at the stage of FIG. 9C) can be done, for example, by depositing a thin film 1004 (FIG. 10) of a solder-wettable material on the pore surfaces of layer 910 in the regions exposed by the mask. For example, a chemical vapor deposition (CVD, possibly plasma-enhanced CVD (PECVD)), can be used to deposit a thin film of titanium, nickel, copper, or other electrically conductive, semiconductor, or dielectric materials, or a combination of these materials, over the pore surfaces of layer 910. Film 1004 is very thin compared to the pore size, and does not fill the pores. The resulting regions 310 are still an open pore network.

In some embodiments, film 1004 is not continuous, and only partially covers the pore surfaces in the region 310. Film 1004 may cover 90% of the pore surfaces, or at least 20%, as needed to obtain reliable solder connections without bridging.

Another possible process, used instead or in addition to CVD, is electroless plating. For example, a thin layer of palladium or gold or copper (possibly a monolayer, e.g. 0.2 to 0.5 nm thick) can be formed in this way. In another example, the structure is dipped into a water-based colloidal suspension of nanoparticles of tin or copper or gold or some other metal or other solder-wettable material, possibly with stabilizers, to form a thin layer of such material on the exposed regions of nanoporous network 910. Again, these films do not fill the pores, and the resulting layer 310 is an open-pore network.

Non-water solvents can also be used if the layer 910 is wettable to such solvents.

Alternatively, solder-wettable regions 310 can be formed by electromagnetic radiation, possibly ultraviolet (UV) or some other spectrum. For example, it is well known that some materials switch between hydrophobic and hydrophilic states when irradiated by UV. Such materials include titania, zinc oxide, tin oxide, and vanadium oxide, which are normally hydrophobic but may become hydrophilic when irradiated. For example, the contact angle of $V_2O_5$ can change reversibly between 0 and 160° due to photogenerated defect sites. Other materials that can switch between the hydrophobic and hydrophilic states under UV radiation include organic compounds, e.g. azobenzene and spiropyran, which can switch between polar and nonpolar forms by UV causing cis-trans transformation or cleavage of a C—O bond. Still other materials include silicon dioxide functionalized with PFTS (perfluorodecyltricholorosilane). See e.g. the following documents incorporated herein by reference:

N. Verplanck et al., "Wettability Switching Techniques on Superhydrphobic Surfaces", Nanoscale Res Lett (2007), 2:577-596, DOI 10.1007/s11671-007-9102-4;

Xia et al., "Smart responsive surfaces switching reversibly between super-hydrophobicity and super-hydrophilicity", Soft Matter, 2009, 5, 275-281.

It is believed that at least some hydrophobic materials described above are not solder wettable to at least some solders. Therefore, in some embodiments, dielectric layer 910 is one of such materials, or a composite including one or more of such materials and possibly but not necessarily including other materials. At the stage of FIGS. 9B-9C, resist 920 can be omitted; regions 310 can be irradiated by UV radiation through a suitable mask (not shown) that blocks the UV from areas other than 310. The mask can be for example a conventional photomask or reticle such as a plate having transparent and opaque areas with respect to the UV radiation (e.g. a glass plate with opaque areas formed by a chrome layer on the glass; other types of masks can also be used). Alternatively, the UV radiation can be a narrow beam supplied only to the regions 310; no mask is needed. In some embodiments, the UV irradiation is performed in oxygen or other suitable ambient. The regions exposed to the UV radiation become hydrophilic while the rest of dielectric 910 remains hydrophobic. In some embodiments, the hydrophilic regions so formed are solder-wettable, but this is not necessary. Whether or not the hydrophilic regions are solder wettable, the structure can be dipped into a water-based electroless plating solution to form a thin layer (possibly a monolayer) of metal (e.g. Ni, Pd, Au, Cu etc.) or some other solder-wettable material on the pore surfaces of the hydrophilic regions but not elsewhere. An exemplary monolayer thickness is 0.2 to 0.5 nm. Alternatively, a dip in a colloidal solution with nanoparticles of these metals and/or other solder-wettable nanoparticles (e.g. tin) can be performed. The pores are not filled, and regions 310 remain open-pore networks. The structure is rinsed and dried after the dip.

The dip can be omitted if the UV radiation alone provides solder wettability.

Further fabrication can proceed as described above in connection with FIGS. 9D-9E.

In other embodiments, layer 910 is initially solder wettable, but regions other than 310 are made non-solder-wettable using the techniques described above (deposition of a non-solder-wettable film in those regions, and/or electromagnetic radiation (possibly UV), or other techniques.

In some embodiments, solder is deposited into the pores of regions 310, possibly filling the pores, before the components 110 and 120 are joined together. For example, in some embodiments, solder-wettable regions 310 are obtained by any process described above. Then, before or after removal of resist 920 (if resist 920 is present), solder is deposited into the pores of regions 310 to form connections 510 (FIG. 11A). For example, the solder can be deposited by electroless plating from a plating solution that wets the regions 310 but not any other regions 910D of dielectric 910. Alternatively, the solder is deposited by dipping the component 120 into molten solder; the solder wets the regions 310 but not the remaining regions 910D of dielectric 910.

Optionally (FIG. 11B), still before attachment of component 110, the non-solder-wettable regions 910D of dielectric 910 are strengthened by partially or completely filling the pores with dielectric. The resulting regions are shown at 1010 in FIG. 11B. In some embodiments, the dielectric is formed by chemical vapor deposition (CVD). A possible dielectric is parylene formed by LPCVD for example. In some embodiments, the precursor for parylene CVD is [2.2] paracyclophane; the parylene is self-initiated (no initiator is needed) and un-terminated (no termination group is needed).

In some embodiments, no solvent or catalyst is required. Exemplary parylene materials are parylene N and AF-4 (they have no functional groups); they can be pin-hole free at about 14 Å.

In the CVD process, the [2.2] paracyplophane precursor runs through the porous dielectric 910, and is adsorbed by dielectric 910 through physisorption at low temperatures, e.g. 25° C. The precursor is subjected to pyrolysis at higher temperatures, e.g. 680° C. Then the pressure is maintained at 0.1 Torr during the CVD polymerization process.

The dielectric can be deposited in regions 910D before or after solder deposition in regions 310.

Then the components 110 and 120 are aligned (FIG. 11C) and joined together (FIG. 11D) in a solder reflow process as described above. Component 110 may be of any type, with solderable surfaces at contacts 110C. In the example shown, component 110 includes a passivation layer 410 (dielectric) covering the whole bottom surface of the component except at contact pads 110C. The bottom surfaces of passivation 410 and contact pads 110C may or may not be co-planar. When the components 110 and 120 are joined together (FIG. 11D), in some embodiments, passivation 410 adheres to regions 1010 to strengthen the structure as described above in connection with FIG. 9E. These details are not limiting; partially or completely filling the pores of regions 310 with solder before component attachment can be done in other fabrication processes described above, including for example the process of FIGS. 4C and 4D.

Many variations are possible. For example, dielectric layer 910 can be patterned by trenches 1110 (FIG. 12) laterally surrounding the regions 310 and providing additional protection against solder bridging. FIG. 12 shows a cross sectional view, and shows a top view in insert D. The trenches can be formed at any suitable fabrication stage, e.g. after removal of resist 920 of FIG. 9C if the resist has been used. In insert D, the trenches are shown as a continuous trench separating the regions 310 from each other, but other geometry is possible, e.g. the trenches can be provided only on one or two or three sides of a region 310 and can be provided adjacent to some but not other regions. The trenches can be etched in dielectric 910 or 1010 before the components 110 and 120 are joined together. The trenches can be filled with gas e.g. air, possibly at vacuum, or can be at least partially filled with a solid dielectric. In the embodiment of FIGS. 11A-11D, if a dielectric (e.g. parylene) is deposited to form regions 1010, then the trenches can be etched before or after the dielectric deposition (i.e. before or after the stage of FIG. 11B).

If the trenches are provided before the stage of FIG. 11B, they can be at least partially filled parylene or other dielectric in a process described above in connection with FIG. 11B (dielectric deposition into the pores of layer 910).

In a variation, the trenches 1110 are a solid dielectric formed before deposition of layer 910—see FIG. 13A. Then layer 910 is deposited (FIG. 13B). In some embodiments, the layer 910 has a planar top surface co-planar with the dielectric 1110; the planar top surface can be obtained, for example, by polishing. Exemplary materials for dielectric 1110 include porous and non-porous dielectrics, including inorganic materials (e.g. silicon dioxide), organic materials (e.g. organic polymers), and combinations thereof. The processing then proceeds as in any of the embodiments described above in connection with FIGS. 9A-11D.

Figure 14B:
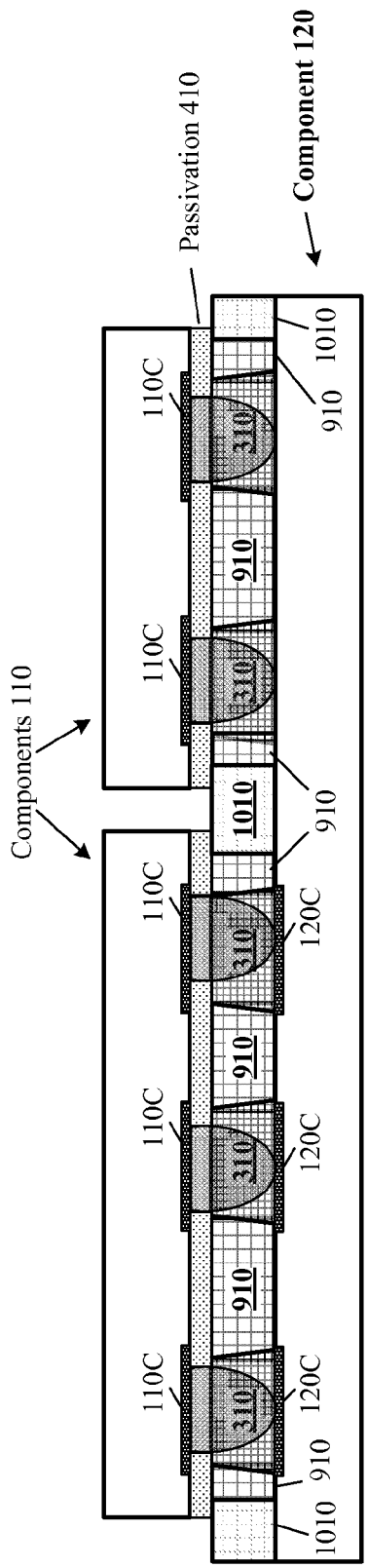

In some embodiments, parylene or other dielectric can be formed in pores of layer 910 after the attachment of components 110 and 120. For example, in FIG. 14A, chips 110 are bonded to a component 120 as in FIG. 9E. Dielectric regions of layer 910 between chips 110 are still open-pore networks; these regions are exposed. Then (FIG. 14B), parylene or other dielectric is deposited, e.g. by CVD, into the pores of layer 910 in these exposed regions. The dielectric can at least partially spread into the areas under the chips.

The invention is not limited to the embodiments described above. Some embodiments are defined by the following clauses:

Clause 1. An assembly comprising:

a first component (e.g. 110 or 120) comprising a substrate (e.g. 120S) and circuitry supported by the substrate, the circuitry comprising one or more contact pads; and a second component (e.g. 110 or 120) comprising a substrate and circuitry supported by the substrate, the circuitry of the second component comprising one or more contact pads each of which is attached to a contact pad of the first component by a connection (e.g. 510) comprising:

an open-pore porous network; and solder in pores of the open-pore porous network.

2. The assembly of clause 1 wherein each said connection comprises a segment (e.g. 510M or the entire connection 510) within which an entire exterior surface of the connection is in physical contact with first dielectric. For example, the first dielectric may include air and/or underfill 460 and/or 910 and/or 1010.

3. The assembly of clause 2 wherein for each said connection, the first dielectric comprises an open-pore porous network (e.g. 910 in FIG. 9E) that is less wettable to the solder of the connection than is the open-pore porous network of the connection.

4. The assembly of clause 3 wherein:

the open-pore porous network of the connection comprises a first open-pore porous network and a film (e.g. 1004) on pore surfaces of the first open-pore porous network, and the open-pore porous network of the first dielectric is continuous with the first open-pore porous network of the connection, the film not extending to the open-pore porous network of the first dielectric.

5. The assembly of clause 3 or 4 wherein the first dielectric comprises dielectric (e.g. parylene at 1010) in pores of the open-pore porous network of the first dielectric.

6. The assembly of any preceding clause, wherein in at least one connection, the solder extends from a non-porous layer in the first component to a non-porous layer in the second component. For example, the non-porous layers can be the surfaces of contact pads 110C, 120C.

7. The assembly of clause 6 wherein the non-porous layers of the first and second components are metal layers.

8. The assembly of claim 1 wherein the open-pore porous network is composed of metal.

9. The assembly of any preceding clause wherein in at least one connection, the porous network extends from a non-porous layer in the first component to a non-porous layer in the second component.

10. The assembly of clause 9 wherein the non-porous layers of the first and second components are metal layers.

11. An assembly comprising:

a first component comprising circuitry comprising one or more contact pads; and a second component comprising circuitry comprising one or more contact pads each of which is attached to a contact pad of the first component by a connection comprising solder in pores of an open-pore porous network;

wherein each said connection comprises a segment (e.g. 510M or the entire connection 510) within which an entire exterior surface of the connection is in physical contact with first dielectric (e.g. air and/or underfill 460 and/or some other dielectric).

12. The assembly of clause 11 wherein for each said connection, the first dielectric comprises an open-pore porous network that is less wettable to the solder of the connection than is the open-pore porous network of the connection.

13. The assembly of clause 12 wherein:

the open-pore porous network of the connection comprises a first open-pore porous network and a film on pore surfaces of the first open-pore porous network, and the open-pore porous network of the first dielectric is continuous with the first open-pore porous network of the connection, the film not extending to the open-pore porous network of the first dielectric.

14. The assembly of clause 12 or 13 wherein the first dielectric comprises second dielectric in pores of the open-pore porous network of the first dielectric.

15. The assembly of any preceding clause wherein in at least one connection, the solder extends from a non-porous layer in the first component to a non-porous layer in the second component.

16. The assembly of clause 15 wherein the non-porous layers of the first and second components are metal layers.

17. The assembly of any preceding clause wherein in at least one connection, the porous network extends from a non-porous layer in the first component to a non-porous layer in the second component.

18. The assembly of clause 17 wherein the non-porous layers of the first and second components are metal layers.

19. The assembly of any one of clauses 11 through 18 wherein the open-pore porous network is composed of metal.

20. A fabrication method comprising:

obtaining a first component comprising circuitry comprising one or more contact structures, each contact structure comprising an open-pore porous network;

obtaining a second component comprising circuitry;

attaching the first component to the second component using solder in pores of the open-pore porous network at each contact structure.

21. The fabrication method of clause 20 wherein the open-pore porous network of each contact structure is wettable to the solder.

22. The fabrication method of clause 20 wherein obtaining the first component comprises:

obtaining a sub-component (e.g. 120 in FIG. 9A but without layer 910); and forming the open-pore porous network (e.g. 910/310 of FIG. 9D) on the sub-component.

23. The fabrication method of clause 22 wherein forming the open-pore porous network on the sub-component comprises:

forming a first open-pore porous network at each said contact structure and adjacent to each said contact structure; and making the first open-pore porous network more wettable to the solder at each said contact structure than adjacent to each said contact structure.

24. The fabrication method of clause 23 wherein making the first open-pore porous network more wettable to the solder at each said contact structure comprises forming a film over at least a portion of pore surfaces of the first open-pore porous network at each said contact structure, the film being more wettable to the solder than is the first open-pore porous network.

25. The fabrication method of clause 24 further comprising, before forming the film, selectively exposing the first open-pore porous network to electromagnetic radiation at each said contact structure to make the first open-pore porous network more solder wettable to a first material (e.g. water) at each said contact structure than adjacent to each said contact structure;

wherein forming the film comprises contacting the first open-pore porous network with a mixture of the first material in liquid phase and a second material (e.g. metal particles), to cause the second material to adhere to the first open-pore porous network at each said contact structure.

26. The fabrication method of clause 23 wherein making the first open-pore porous network more wettable to the solder at each said contact structure comprises selectively exposing the first open-pore porous network to electromagnetic radiation at each said contact structure to make the first open-pore porous structure more solder wettable at each said contact structure than adjacent to each said contact structure.

27. The component of any one of clauses 20 to 26 further comprising depositing the solder into the open-pore porous network of each said contact structure before attaching the first component to the second component.

28. A component comprising circuitry comprising one or more contact structures, the component comprising a sub-component and an open-pore porous network on the sub-component, wherein for each said contact structure, the open-pore porous network comprises a part within the contact structure and comprises another part which is adjacent to the contact structure and which is less solder wettable than the part within the contact structure.

29. The component of clause 28 wherein the open-pore porous network comprises:

a first open-pore porous network at each said contact structure and adjacent each said contact structure; and a film on pore surfaces of the first open-pore porous network at each said contact structure but not adjacent to each said contact structure, the firm being more wettable to the solder than the first open-pore porous structure.

30. The component of clause 28 or 29 further comprising the solder in pores of the open-pore porous network at each said contact structure but not adjacent to each said contact structure.

31. A fabrication method comprising:

obtaining a sub-component; and forming an open-pore porous network on the sub-component to obtain a first component comprising circuitry comprising one or more contact structures, each contact structure comprising at least a part of the open-pore porous network.

32. The fabrication method of clause 31 wherein forming the open-pore porous network on the sub-component comprises:

forming a first open-pore porous network at each said contact structure and adjacent to each said contact structure; and making the first open-pore porous network more wettable to the solder at each said contact structure than adjacent to each said contact structure.

33. The fabrication method of clause 32 wherein making the first open-pore porous network more wettable to the solder at each said contact structure comprises forming a film over at least a portion of pore surfaces of the first open-pore porous network at each said contact structure, the film being more wettable to the solder than is the first open-pore porous network.

34. The fabrication method of clause 33 further comprising, before forming the film, selectively exposing the first open-pore porous network to electromagnetic radiation at each said contact structure to make the first open-pore porous network more wettable to a first material at each said contact structure than adjacent to each said contact structure;

wherein forming the film comprises contacting the first open-pore porous network with a mixture of the first material in liquid phase and a second material, to cause the second material to adhere to the first open-pore porous network at each said contact structure.

35. The fabrication method of clause 32 wherein making the first open-pore porous network more wettable to the solder at each said contact structure comprises selectively exposing the first open-pore porous network to electromagnetic radiation at each said contact structure to make the first open-pore porous network more solder wettable at each said contact structure than adjacent to each said contact structure.

36. The component of any one of clauses 31 to 35 further comprising depositing the solder into the open-pore porous network of each said contact structure before attaching the first component to a second component.

Other embodiments and variations are within the scope of the invention, as defined by the appended claims.

The invention claimed is:

1. An assembly comprising:
a first component comprising:
a substrate and circuitry supported by the substrate, the circuitry comprising one or more first contact pads; and
an open-pore porous network overlying the substrate and the one or more first contact pads, the open-pore porous network comprising a first side facing the substrate, and comprising a second side opposite to the first side, the open-pore porous network comprising a dielectric part extending from the first side to the second side;
a second component comprising a substrate and circuitry supported by the substrate, the circuitry of the second component comprising one or more second contact pads, the second component comprising dielectric surrounding each second contact pad;
wherein each first contact pad is attached to a second contact pad by a connection comprising:
a part of the open-pore porous network; and
solder in pores of said part of the open-pore porous network;
wherein the dielectric of the second component physically contacts, and adheres to, the second side of the open-pore porous network, but the dielectric of the second component does not penetrate an entire thickness of the dielectric part of the open-pore porous network and does not reach the first side of the dielectric part of the open-pore porous network.

2. The assembly of claim 1 wherein for each said connection, the part of the open-pore porous network of the connection is more wettable to the solder of the connection than is the dielectric part attached to the dielectric of the second component.

3. The assembly of claim 2 wherein, for at least one said connection:
the part of the open-pore porous network of the connection comprises a first open-pore porous network and a film on pore surfaces of the first open-pore porous network, and
the dielectric part of the open-pore porous network is continuous with the part of the open-pore porous network of the connection, the film not extending to the dielectric part of the open-pore porous network.

4. The assembly of claim 3, wherein the film is composed of metal.

5. The assembly of claim 2, further comprising a dielectric in pores of the dielectric part of the open-pore porous network.

6. The assembly of claim 1, wherein in at least one connection, the solder extends from a non-porous layer in the first component to a non-porous layer in the second component.

7. The assembly of claim 1 wherein in at least one connection, the porous network extends from a non-porous layer in the first component to a non-porous layer in the second component.

8. A fabrication method comprising:
obtaining a first component comprising circuitry comprising one or more contact structures and comprising an open-pore porous network, each contact structure comprising a part of the open-pore porous network, the first component comprising, in addition to the one or more contact structures, one or more first dielectric parts each of which comprises a part of the open-pore porous network;
obtaining a second component comprising circuitry and comprising one or more second dielectric parts;
after obtaining the first and second components, attaching the first component to the second component, the attaching comprising:
attaching each said contact structure of the first component to the circuitry of the second component using solder in pores of the part of the open-pore porous network at each contact structure; and
attaching each said first dielectric part of the first component to one or more second dielectric parts of the second component.

9. The fabrication method of claim 8 wherein the open-pore porous network of each contact structure is wettable to the solder.

10. The fabrication method of claim 8 wherein obtaining the first component comprises:
obtaining a sub-component; and
forming the open-pore porous network on the sub-component.

11. The fabrication method of claim 10 wherein forming the open-pore porous network on the sub-component comprises:
forming a first open-pore porous network at each said contact structure and adjacent to each said contact structure; and
making the first open-pore porous network more wettable to the solder at each said contact structure than adjacent to each said contact structure.

12. The fabrication method of claim 11 wherein making the first open-pore porous network more wettable to the solder at each said contact structure comprises forming a film over at least a portion of pore surfaces of the first open-pore porous network at each said contact structure, the film being more wettable to the solder than is the first open-pore porous network.

13. The method of claim 8 wherein in said attaching of the first component to the second component, each second dielectric part adheres to a first dielectric part but does not penetrate an entire thickness of the first dielectric part.

14. The method of claim 8 wherein in said attaching of the first component to the second component, each second dielectric part adheres to a first dielectric part but does not penetrate an entire thickness of the open-pore porous network.

* * * * *